United States Patent [19] [11] 3,965,347
Heywang [45] June 22, 1976

[54] ELECTROLUMINESCENT SEMICONDUCTOR DIODE WITH HETERO-STRUCTURE

[75] Inventor: Walter Heywang, Neukeferloh, Germany

[73] Assignee: Siemens Aktiengesellschaft, Berlin, Munich, Germany

[22] Filed: Nov. 12, 1974

[21] Appl. No.: 523,118

[30] Foreign Application Priority Data
Nov. 14, 1973  Germany............................ 2356844

[52] U.S. Cl. ............................... 250/211 J; 357/17
[51] Int. Cl.² ........................................... H01J 39/12
[58] Field of Search ............... 357/17; 250/552, 553, 250/211 J; 313/498, 499

[56] References Cited
UNITED STATES PATENTS

| | | | |
|---|---|---|---|
| 3,537,029 | 10/1970 | Kressel et al. | 357/17 |
| 3,617,820 | 11/1971 | Herzog | 357/17 |
| 3,636,471 | 1/1972 | Rediker | 357/17 |
| 3,758,875 | 9/1973 | Hayashi | 250/552 |
| 3,852,797 | 12/1974 | Lebailly et al. | 250/211 J |

Primary Examiner—Alfred E. Smith
Assistant Examiner—D. C. Nelms
Attorney, Agent, or Firm—Hill, Gross, Simpson, Van Santen, Steadman, Chiara & Simpson

[57] ABSTRACT

An electroluminescent semiconductor diode having a homogeneous monocrystalline semiconductor substrate providing a first zone on which an epitaxial layer has been formed providing a second zone. This second zone has a forbidden-band-width which changes steadily with increasing distance from the first zone. This second zone possesses a junction between a sub-zone having the properties of a "direct semiconductor" and a sub-zone having the properties of a so-called "indirect semiconductor" which lies parallel to the boundary between the first zone and the second zone and also parallel to the pn-junction of the diode. The pn-junction of the diode is located in the second zone and particularly in the sub-zone have the properties of an "indirect semiconductor" but at such a short distance from the junction of the two sub-zones that the major part of the charge carriers injected from the pn-junction in the direction towards the sub-zone having the properties of a direct semiconductor pass to this latter sub-zone.

14 Claims, 3 Drawing Figures

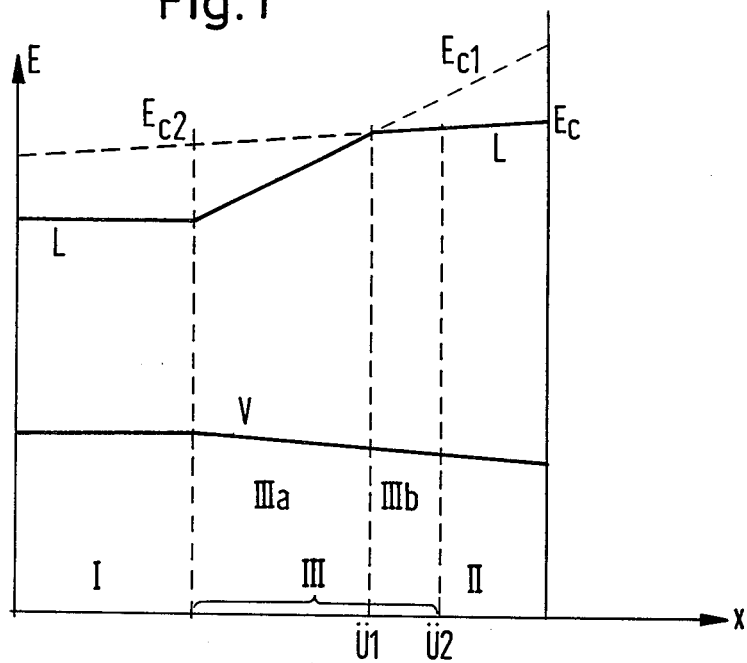
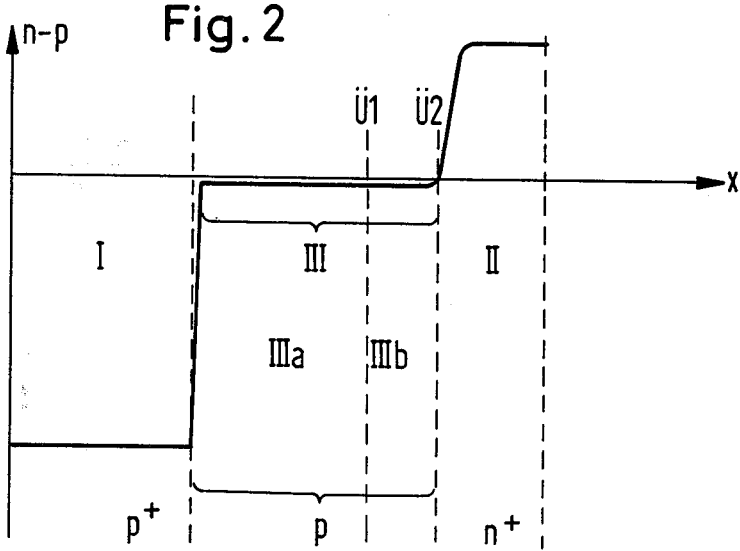

3,965,347

ELECTROLUMINESCENT SEMICONDUCTOR DIODE WITH HETERO-STRUCTURE

FIELD OF THE INVENTION

The invention relates to an electroluminescent semiconductor diode whose monocrystalline semiconductor body, which is provided with a pn-junction and with in each case one electrode on both sides of the pn-junction, consists of a homogeneous first zone and a second zone grown epitaxially on this first zone with a forbidden-band-width which changes steadily with increasing distance from the first zone, and in which the inhomogeneous second zone also possesses a junction between a sub-zone having the properties of a so-called "direct semiconductor" and a sub-zone having the properties of a so-called "indirect semiconductor" which runs parallel to the boundary between the first zone and the second zone and also to the pn-junction of the diode.

Electroluminescent semiconductor diodes of this type are known per se. They are usually produced by epitaxy. A method frequently employed for this purpose consists in bringing a monocrystalline gallium arsenide wafer of the one conductivity type into contact at one of its main surfaces with a mixed melt which contains not only the required doping from a solution but also the component required for the "indirect semiconductor" sub-zone. Then, by means of successive cooling, an epitaxial layer having a steadily changing band width is deposited from this mixed melt. If the range allowed for the composition of the melt is sufficiently large, a junction between a "direct semiconductor" sub-zone and an "indirect semiconductor" sub-zone is achieved. "Direct semiconductors" are for example Si, Ge, $(Ga_{1-x}Al_x)As$ with $x < 0.4$ and $Ga(As_{1-y}P_y)$ with $y < 0.46$, whereas "indirect semiconductors" are for example GaAs, InAs, $(Ga_{1-x}Al_x)As$ with $x > 0.4$ and $Ga(As_{1-y}P_y)$ with $y > 0.46$. It is particularly favorable to use a mixed melt composed of gallium, aluminum and gallium arsenide from which, by the described epitaxial deposition method, an epitaxial layer is produced on the surface of the substrate which consists of doped gallium arsenide, the aluminum content of which epitaxial layer increases with growing distance from the substrate. The properties of the mixed crystal are expressed, as usual, by the formula $(Ga_{1-x}Al_x)As$, where $0 < x < 1$. In the graduated epitaxial layer which has been produced in the manner described above, $x$ increases steadily with increasing distance from the substrate. If the aluminum content in the starting melt is sufficiently large, then finally in the course of the deposition process the value $x = 0.4$ is exceeded. At this value of the concentration parameter $x$, the character of the semiconductor material changes from the "direct semiconductor" initially deposited into the "indirect semiconductor." Another possibility is to grow, e.g., $Ga(As_{1-y}P_y)$ from the gas phase into gallium. In this case an increasing quantity of $PH_3$ is added to the gas mixture in proportion to the increase in distance from the GaAs substrate. If $y$ is smaller than 0.46, the mixed crystal will have the characteristics of a "direct semiconductor," otherwise it will have those of an "indirect semiconductor".

In respect of the above-defined luminescent semiconductor diodes, it is important for the recombination probability in the second zone to lie well above that of the first zone. This is generally achieved if the first zone consists of a so-called "direct semiconductor" and the second zone of "an indirect semiconductor." In the case of "direct semiconductors" an optically radiant recombination of charge carriers is possible without other partners, whereas in the case of "indirect semiconductors" it is not.

A particularly important example consists in the production of the shortest possible wave length light with the aid of direct recombination. For this purpose arrangements consisting of the semiconductors $(Ga_{1-x}Al_x)As$ and $Ga(As_{1-y}P_y)$ with the junction concentrations $x \approx 0.4$ and $y \approx 0.46$, are of particular significance as these provide the maximum band intervals at which direct recombination still exists. As, however, such a composition can only be realized with difficulty in a monocrystalline homogeneous semiconductor, instead one employs semiconductor crystals which consist of a layer of such a semiconductor epitaxially grown on a substrate crystal, in which, as is known the $x$- and $y$-values alter steadily and non-ambiguously with increasing distance from the substrate. It is then possible to position the pn-junction in the vicinity of the desired $x$- or $y$-value.

The slow change in the properties of the light-producing semiconductor layer at the same time however, causes a considerable reabsorption of the produced light.

SUMMARY OF THE INVENTION

In accordance with the present invention, in the electroluminescent semiconductor diode defined above, the pn-junction arranged in the inhomogeneous second zone should be located in a sub-zone having the properties of an "indirect semiconductor" and that it should be located at such a short distance from the junction between the two sub-zones of the inhomogeneous second zone that the major part of the charge carriers injected from the pn-junction of the diode in the direction towards the sub-zone having the properties of a "direct semiconductor" pass this junction into the sub-zone have the properties of the "direct semiconductor."

For this reason, it is proposed in accordance with the invention that the gradient of $x$ and $y$ should be selected to be substantially higher than $10^{-3} \mu m^{-1}$ and that the pn-junction should be positioned in the indirect region of the semiconductor, with a doping, the nature and degree of which is such that during the transition of current, charge carriers are mainly injected in the direction towards the direct semiconductor junction. A value of at least $10^{-2} \mu m^{-1}$ and particularly at least $3.10^{-2} \mu m^{-1}$ is to be recommended for the gradient of $x$ and $y$. A prerequisite is that injected charge carriers should reach the "direct" semiconductor zone without any undesired, non-radiant recombination. This is governed not only by the diffusion length $\lambda$ of the charge carriers but also by the drift field produced by the reducing band interval which predominates at higher concentration gradients. Namely the diffusion length $\lambda$ is generally governed by $$\lambda = \left[ \frac{kT}{e} \mu \cdot \tau \right]^{1/2}$$

and the drift path $d$ accomplished on account of the change in band interval $\Delta E$ in the region of the drift path is governed by $$d = \mu \cdot \frac{\Delta E}{d} \tau \text{ or } d = \sqrt{\mu \cdot \Delta E \cdot \tau}$$

where $k$ = Boltzmann constant, T = temperature of the crystal, $\mu$ = mobility of the electrons, $\Delta E$ = change of band width, $\tau$ = recombination time, and $e$ = elemental charge.

If, for example, one assumes that $\mu m = 4000$ cm$^2$/v sec, T = 300°K, $\tau = 10^{-8}$ sec, and $\Delta E = 1/10$ eV, then we have $\lambda = 10$ $\mu m$ and $d = 20$ $\mu m$, which must be brought up to the direct semiconductor zone which can be effected easily from a technical viewpoint. The only prerequisite is a band interval gradient of 1/200 eV/mm.

In a further development of the invention, it is advisable for reasons which will now be clear, that a. The distance of the pn-junction from the junction between the "direct semiconductor" sub-zone to the "indirect semiconductor" sub-zone should at the maximum amount to one diffusion length of the charge carriers, in particular electrons to be subjected to recombination, and b. The gradient of the change in band width in the inhomogeneous second zone of the arrangement should be selected to be such that it accelerates at least the major part of the charge carriers injected from the pn-junction in the direction towards the junction between the sub-zones having the "direct semiconductor" properties and the sub-zone having the "indirect semiconductor" properties.

c. Finally, the doping in the epitaxial layer, thus in the inhomogeneous second zone can in known manner be represented to be graduated in such a way that the electric drift field due to the change in doping accelerates the charge carriers likewise out of the sub-zone having the properties of a "direct semiconductor" in the direction towards the sub-zone having the properties of an "indirect semiconductor".

d. As electrons acting as charge carriers are known by experience to have a greater diffusion length than holes, it is advisable for the homogeneous first zone and the adjacent sub-zone having "direct semiconductor" properties to be p-conducting, and that the n-conducting region be in the sub-zone having "indirect semiconductor" properties.

BRIEF DESCRIPTION OF THE DRAWINGS

The invention will now be explained in detail making reference to the drawings in which:

FIG. 1 illustrates the band and doping conditions of a preferred embodiment;

FIG. 2 shows an example of an arrangement in accordance with the invention; and

DESCRIPTION OF THE PREFERRED EMBODIMENTS

Figure 3:
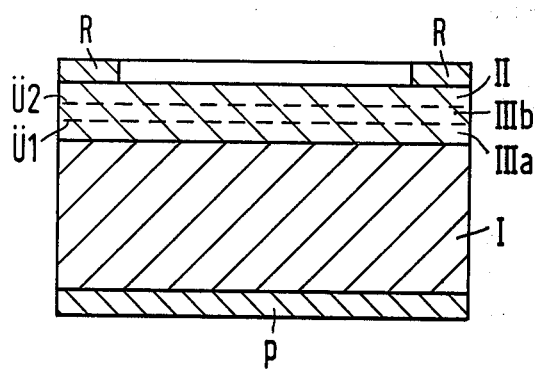
FIG. 3 is a diagrammatic sectional view of a semiconductor device embodying the invention.

FIG. 1 illustrates the band doping in a semiconductor device such as is illustrated in FIG. 3. FIG. 2 shows the relative doping concentration across the device at right angles to the junctions. Thus the diagrams employ as the abscissa a coordinate $x$ running at right angles to the junctions. In FIG. 1, the ordinate represents the energy E in and on the forbidden band on both sides of the junction between the relevant semiconductors of the arrangement in accordance with the invention. In FIG. 2, the ordinate represents the net doping $(n-p)$ as a function of $x$. FIGS. 1 and 2 illustrate three zones I, II and III. The left-hand zone I shows the conditions in a substrate which consists of a "direct semiconductor" in particular monocrystalline GaAs and which in the example is highly doped with an activator, for example Zn, which produces p-conductivity, in order to keep the conductivity of the substrate, which basically plays the role of a supply line, as low as possible. The substrate I is adjoined by a zone having a reducing Ga-content and an increasing Al-content, i.e., an area II and III composed of graduated (Ga, Al)As which in zone III is likewise doped with an activator producing p-conductivity, although considerably weaker than zone I. With increasing Al-content and simultaneously reducing Ga-content, one finally reaches the junction $\ddot{U}_1$ from a direct to an indirect semiconductor. This junction $\ddot{U}_1$ divides the p-conducting (Ga, Al)As zone III into the two parts III$a$ and III$b$. The sub-zone III$a$ consists of a direct semiconductor, whereas the sub-zone III$b$ already consists of an indirect semiconductor.

After the junction $\ddot{U}_1$ has been formed by the epitaxial deposit of sub-zone III$b$, the conductivity type is changed for the production of the pn-junction $\ddot{U}_2$. For this purpose the melt from which the epitaxial deposition takes place is mixed to an appropriate extent with a donor for example, Te in high concentration, in particular to the saturation limit to get an N+ region. The zone II which is thus deposited therefore becomes n-conducting.

If this pn-junction $\ddot{U}_2$ is forwardly biased so that it operates in the forward direction, charge carriers are mainly injected in the direction towards the junction $\ddot{U}_1$ and the direct zone III$a$ located on the other side of this junction $\ddot{U}_1$. As small as possible a distance between the junctions $\ddot{U}_1$ and $\ddot{U}_2$ ensures that as many as possible charge carriers are recombined in the zone III$a$ and I composed of direct semiconductor material.

A great change in the composition in the n-conducting part of the zone II consisting of indirect semiconductor material is not necessary. These layer components will also be made as thin as possible in the interests of the least possible absorption of the produced light. It is necessary to contact the zone II by a transparent electrode or by a ring electrode in order to complete the arrangement. The substrate, i.e., the p-conducting zone I is also contacted with a nonblocking electrode, like the zone II.

An embodiment of the finished arrangement is illustrated in FIG. 3. An epitaxial layer with a composition and doping which changes in accordance with FIGS. 1 and 2 is deposited by epitaxy from the gas phase or the molten phase upon the substrate I which consists of p-conducting monocrystalline GaAs. The n$^+$-conducting layer II, arranged above the pn-junction $\ddot{U}_2$, of the epitaxial layer is contacted with a ring electrode R which covers only the periphery of this layer II. The substrate is supported and contacted by a plate-shaped electrode P. Vice versa to the described mode of operation, it is also possible to use a substrate consisting of an "indirect semiconductor" upon which there is then deposited an epitaxial layer to which, during the course of the deposition, increasing quantities of a "direct semiconductor" are added until the junction with the "direct semiconductor" is exceeded. The change of doping for the pn-junction must then be effected during deposition actually before this junction is reached.

Also shown in FIG. 1 is the upper edge V of the valence band and the lower edge L of the conductivity band. The course of the conductivity band shown in FIG. 1 (which under the stated doping conditions is particularly important for the emission behavior of the diode in accordance with the invention) clearly shows the arm to approach the direct zone (associated arm $E_{c1}$ = central minimum) and that to approach the indirect zone (associated arm $E_{c2}$ = sub minimum) and the bend which defines the junction $Ü_1$. In the event of the reversal of the doping conditions which have been described with reference to the examples, the valence band would instead play the more important role.

It will be apparent to those skilled in the art that many modifications and variations may be effected without departing from the spirit and scope of the novel concepts of the present invention.

I claim as my invention:

1. An electroluminescent diode comprising a homogeneous monocrystalline semiconductor body forming a first zone, an inhomogeneous epitaxial second zone having a forbidden-band-width which changes steadily with increasing distance from said first zone, the second zone having a first sub-zone with properties of a direct semiconductor adjacent said first zone and a second sub-zone interfaced with said first sub-zone, said second sub-zone having the properties of an indirect semiconductor, the junction between the two sub-zones lying parallel to the junction between said first and second zones, said second zone also having a third sub-zone of a conductivity type opposite to that of said first zone and said first and second sub-zones, which third sub-zone is interfaced with said second sub-zone to form a pn-junction with said second sub-zone, the distance between said first and second sub-zone junction and said pn-junction being such that the major part of the charge carriers injected into said second sub-zone from said pn-junction towards said direct semiconductor sub-zone reach said direct semiconductor sub-zone.

2. An electroluminescent diode according to claim 1, in which said distance between said junctions is less than the diffusion length of the major part of said charge carriers.

3. An electroluminescent diode according to claim 1, in which said homogeneous first zone consists of GaAs, and said inhomogeneous second zone consists of $(Ga_{1-x}Al_x)As$, where $x$ increases steadily with increasing distance from the homogeneous first zone and exceeds the value 0.4.

4. An electroluminescent diode according to claim 1, in which said homogeneous first zone consists of GaAs, and said inhomogeneous second zone consists of $Ga(As_{1-y}P_y)$ where $y$ increases steadily with increasing distance from said homogeneous first zone and exceeds the value 0.46.

5. An electroluminescent diode according to claim 1, in which the homogeneous first zone and the adjacent sub-zone having the "direct semiconductor" properties are p-conducting, and wherein the sub-zone having the "indirect semiconductor" properties includes an n-conducting zone.

6. An electroluminescent diode according to claim 1, in which the gradient of the change in band width in the inhomogeneous second zone is selected to be such that it accelerates at least the major part of the charge carriers injected from the pn-junction in the direction towards the junction between said first and second sub-zones.

7. An electroluminescent diode according to claim 3, in which the gradient of the change of $x$ is set at a value of at least $10^{-2}\,\mu m^{-1}$.

8. An electroluminescent diode according to claim 4, in which the gradient of the change of $y$ is set at a value of at least $10^{-2}\,\mu m^{-1}$.

9. An electroluminescent diode according to claim 3, in which the gradient of the change of $x$ is set at a value of at least $3.10^{-2}\,\mu m^{-1}$.

10. An electroluminescent diode according to claim 4, in which the gradient of the change of $y$ is set at a value of at least $3.10^{-2}\,\mu m^{-1}$.

11. An electroluminescent diode according to claim 1, in which the doping along the path of the charge carriers to be subjected to recombination is selected to be such that it causes in known manner a drift field which accelerates the charge carriers along this path.

12. An electroluminescent diode according to claim 1, in which said homogeneous first zone consists of GaAs, the first sub-zone of said inhomogeneous second zone consists of $(Ga_{1-x}Al_x)As$, and said second subzone of said inhomogeneous second zone consists of $(Ga_{1-x}Al_x)$ and $Ga(As_{1-y}P_y)$, where $y$ exceeds the value 0.46.

13. An electroluminescent diode according to claim 12, wherein the junction concentrations at the first and second subzone junctions are $x \approx 0.4$ and $y \approx 0.6$.

14. An electroluminescent diode comprising a homogeneous monocrystalline semiconductor body comprising a plurality of planar regions interfaced with each other, a first region being a direct semiconductor, a second region of the same impurity type as said first region interfaced with said first region and being a direct semiconductor, a third region of the same impurity type as said first region interfaced with said second region and being an indirect semiconductor, fourth region of the opposite impurity type as said first region interfaced with said third region and being an indirect semiconductor, the junction between said third and fourth regions being a pn-junction spaced from the junction between said second and third regions by a distance such that the major part of the charge carriers injected into said third region from said pn-junction towards said second region reach said second region.

* * * * *